US009721676B2

(12) United States Patent
Mazzoccoli et al.

(10) Patent No.: US 9,721,676 B2
(45) Date of Patent: Aug. 1, 2017

(54) DEPOSITION OF A PROTECTIVE COATING INCLUDING METAL-CONTAINING AND CHROMIUM-CONTAINING LAYERS ON ZIRCONIUM ALLOY FOR NUCLEAR POWER APPLICATIONS

(71) Applicant: WESTINGHOUSE ELECTRIC COMPANY LLC, Cranberry Township, PA (US)

(72) Inventors: Jason P. Mazzoccoli, Pittsburgh, PA (US); Peng Xu, Columbia, SC (US); Sumit Ray, Columbia, SC (US); Carroll J. Long, Jr., Columbia, SC (US); Grant L. Eddy, West Columbia, SC (US)

(73) Assignee: Westinghouse Electric Company, LLC, Cranberry Township, PA (US)

( * ) Notice: Subject to any disclaimer, the term of this patent is extended or adjusted under 35 U.S.C. 154(b) by 601 days.

(21) Appl. No.: 14/287,435

(22) Filed: May 27, 2014

(65) Prior Publication Data
US 2015/0348652 A1    Dec. 3, 2015

(51) Int. Cl.
*B32B 15/01* (2006.01)
*G21C 3/07* (2006.01)
(Continued)

(52) U.S. Cl.
CPC ............. *G21C 3/07* (2013.01); *C23C 4/08* (2013.01); *C23C 4/134* (2016.01); *C23C 14/16* (2013.01);
(Continued)

(58) Field of Classification Search
None
See application file for complete search history.

(56) References Cited

U.S. PATENT DOCUMENTS 3,310,480 A    3/1967  Brown
3,502,549 A    3/1970  Charveriat
(Continued)

FOREIGN PATENT DOCUMENTS

CA    2159371 A1    4/1996
CA    2598396 A1    8/2006
(Continued)

OTHER PUBLICATIONS

Valeeva et al., "Ni-based protective-lubricant coatings for zirconium alloys", Inorganic Materials: Applied Research, May 2012, vol. 3, Issue 3, pp. 226-230.
(Continued)

*Primary Examiner* — Daniel J Schleis
(74) *Attorney, Agent, or Firm* — Eckert Seamans Cherin & Mellott, LLC; Carol A. Marmo (57) ABSTRACT

The invention relates to compositions and methods for coating a zirconium alloy cladding of a fuel element for a nuclear water reactor. The coating includes a first tier or layer and a second tier or layer. The first layer includes an elemental metal and the second layer is an oxidation-resistant layer that includes elemental chromium. The first layer serves as an intermediate layer between the zirconium alloy substrate and the second layer. This intermediate layer can be effective to improve adhesion of the second layer to the zirconium alloy substrate. The multilayer coating forms a protective layer which provides improved capability for the zirconium alloy cladding to withstand normal and accident conditions to which it is exposed in the nuclear reactor.

6 Claims, 4 Drawing Sheets

(51) Int. Cl.

| | | |
|---|---|---|
| *C23C 4/08* | (2016.01) | |
| *C23C 16/06* | (2006.01) | |
| *C23C 16/455* | (2006.01) | |
| *C23C 16/48* | (2006.01) | |
| *C23C 16/515* | (2006.01) | |
| *C23C 18/54* | (2006.01) | |
| *C23C 28/02* | (2006.01) | |
| *G21C 21/14* | (2006.01) | |
| *G21C 21/16* | (2006.01) | |
| *C23C 4/134* | (2016.01) | |
| *G21C 21/02* | (2006.01) | |
| *C23C 14/16* | (2006.01) | |
| *C25D 5/10* | (2006.01) | |
| *C25D 5/12* | (2006.01) | |
| *C23C 18/16* | (2006.01) | |

(52) U.S. Cl.
CPC ........ *C23C 16/06* (2013.01); *C23C 16/45525* (2013.01); *C23C 16/487* (2013.01); *C23C 16/515* (2013.01); *C23C 18/54* (2013.01); *C23C 28/021* (2013.01); *C23C 28/023* (2013.01); *G21C 21/02* (2013.01); *G21C 21/14* (2013.01); *G21C 21/16* (2013.01); *C23C 18/1651* (2013.01); *C25D 5/10* (2013.01); *C25D 5/12* (2013.01); *Y02E 30/40* (2013.01)

(56) References Cited

U.S. PATENT DOCUMENTS

| | | | |
|---|---|---|---|
| 4,017,368 A | | 4/1977 | Wax et al. |
| 4,029,545 A | | 6/1977 | Gordon et al. |
| 4,229,260 A | * | 10/1980 | Johnson .................... G21C 3/20 376/417 |
| 4,284,660 A | * | 8/1981 | Donaghy ............. C23C 18/1844 148/276 |
| 5,149,420 A | | 9/1992 | Buxbaum et al. |
| 2010/0091934 A1 | | 4/2010 | Kim et al. |
| 2012/0087457 A1 | | 4/2012 | Garnier et al. |
| 2013/0302639 A1 | | 11/2013 | Song et al. |
| 2013/0344348 A1 | | 12/2013 | Koo et al. |

FOREIGN PATENT DOCUMENTS

| | | |
|---|---|---|
| FR | 1527055 A | 5/1968 |
| JP | 2005139478 A | 6/2005 |

OTHER PUBLICATIONS

International Search Report and Written Opinion of the International Searching Authority for PCT/US2015/022898 dated Jul. 17, 2015 (Forms PCT/ISA/220, PCT/ISA/210, PCT/ISA/237).

* cited by examiner

DEPOSITION OF A PROTECTIVE COATING INCLUDING METAL-CONTAINING AND CHROMIUM-CONTAINING LAYERS ON ZIRCONIUM ALLOY FOR NUCLEAR POWER APPLICATIONS

BACKGROUND

1. Field

The invention relates to compositions and methods for manufacturing zirconium-based fuel elements for nuclear water reactors and, more particularly, to zirconium alloy claddings including a chromium coating and an intermediate metallic layer deposited between the cladding and the chromium coating to enhance corrosion resistance under nuclear reactor accident conditions and during normal operation.

2. Description of Related Art

In a typical commercial nuclear water reactor, such as a pressurized water reactor (PWR), heavy water reactor (e.g., a CANDU) or a boiling water reactor (BWR), the reactor core includes a large number of fuel assemblies, each of which is composed of a plurality, e.g., bundles or assemblies, of elongated fuel elements or fuel rods. Fuel assemblies vary in size and design depending on the desired size of the reactor and the core.

The fuel rods each contain nuclear fuel fissile material, such as at least one of uranium dioxide ($UO_2$), plutonium dioxide ($PuO_2$), thorium dioxide ($ThO_2$), uranium nitride (UN) and uranium silicide ($U_3Si_2$) and mixtures thereof. At least a portion of the fuel rods can also include neutron absorbing material, such as, boron or boron compounds, gadolinium or gadolinium compounds, erbium or erbium compounds and the like. The neutron absorbing material may be present on or in pellets in the form of a stack of nuclear fuel pellets. Annular or particle forms of fuel also can be used.

The fuel is encased in sealed tubes, commonly referred to as the fuel cladding. Each of the fuel rods has a cladding that acts as containment to hold the fissile material. The fuel rods are grouped together in an array which is organized to provide a neutron flux in the core sufficient to support a high rate of nuclear fission and thus, the release of a large amount of energy in the form of heat. The cladding maintains the fuel in a position, for which controlled fission can proceed and generate heat. A coolant, such as water, is pumped through the reactor core to extract the heat generated in the reactor core for the production of useful work such as electricity. The cladding then transfers the heat from the fuel to pressurized water that circulates around the primary loop of the reactor coolant system. The heated water in the primary loop is used to boil water in a steam generator and the steam is then expanded in a turbine that powers an electrical generator. Alternatively, the water circulating through the reactor may be allowed to boil to generate steam directly, which is then expanded in a turbine.

In a typical commercial nuclear reactor, the fuel assemblies in the core each have top and bottom nozzles. A plurality of elongated transversely spaced guide thimbles extends longitudinally between the nozzles. The plurality of elongated fuel elements or rods which compose the fuel assemblies are transversely spaced apart from one another and from the guide thimbles. A plurality of transverse support grids are axially spaced along and attached to the guide thimbles. The grids are used to precisely maintain the spacing and support between the fuel rods in the reactor core, provide lateral support for the fuel rods, and induce mixing of the coolant.

Figure 1:
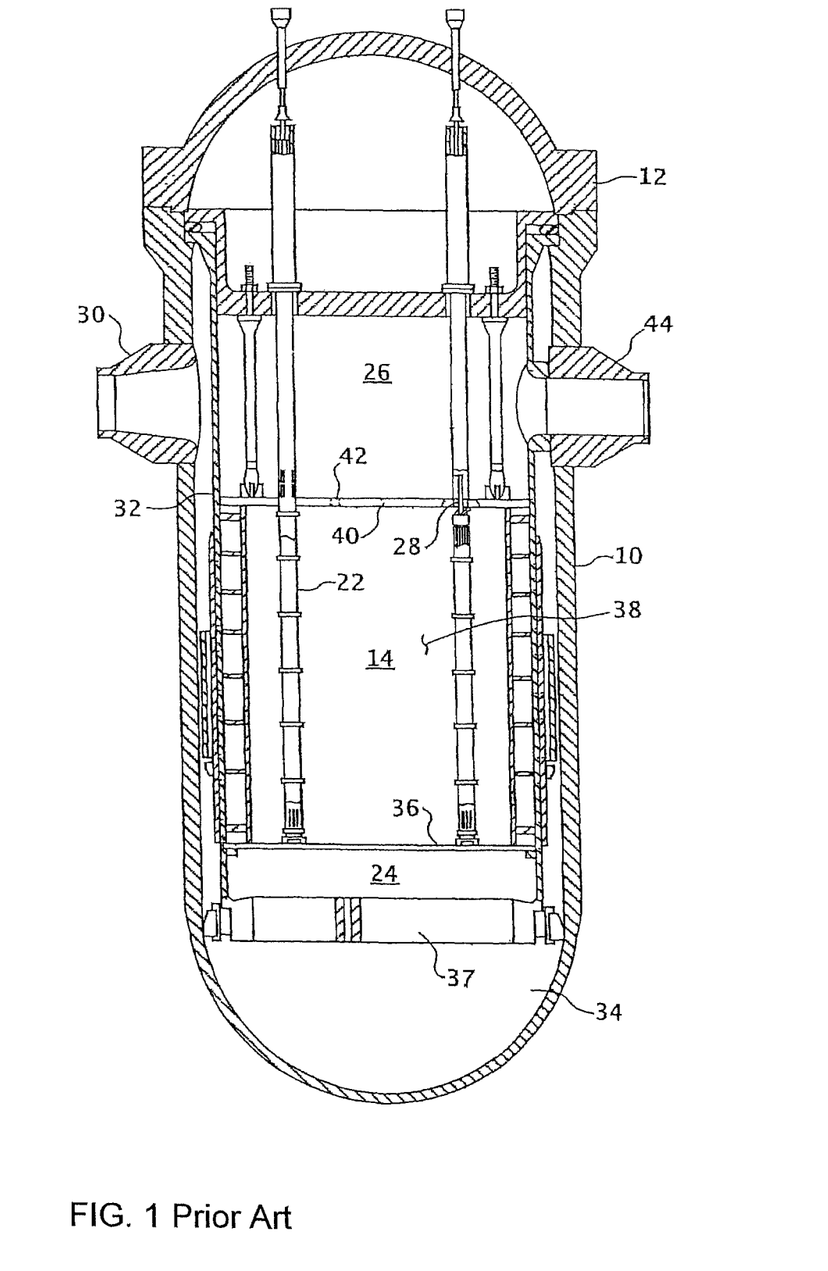
FIG. 1 is an elevational view, partially in section of a nuclear reactor vessel and internal components, in accordance with the prior art.

FIG. 1 shows an exemplary reactor pressure vessel 10 and nuclear core 14. The nuclear core 14 includes a plurality of parallel, vertical, co-extending fuel assemblies 22. For purpose of this description, the other vessel internal structures can be divided into lower internals 24 and upper internals 26. In conventional designs, the lower internals' function is to support, align and guide core components and instrumentation as well as direct flow within the vessel. The upper internals restrain or provide a secondary restraint for the fuel assemblies 22 (only two of which are shown for simplicity in FIG. 1), and support and guide instrumentation and components, such as control rods 28. In the exemplary reactor shown in FIG. 1, coolant enters the reactor vessel 10 through one or more inlet nozzles 30, flows down through an annulus between the vessel and the core barrel 32, is turned 180° in a lower plenum 34, passes upwardly through a lower support plate 37 and a lower core plate 36 upon which the fuel assemblies are seated and through and about the assemblies. In some designs, the lower support plate 37 and the lower core plate 36 are replaced by a single structure, a lower core support plate having the same elevation as 37. The coolant flow through the core and surrounding area 38 is typically large, on the order of 400,000 gallons per minute at a velocity of approximately 20 feet per second. The resulting pressure drop and frictional forces tend to cause the fuel assemblies to rise, which movement is restrained by the upper internals, including a circular upper core plate 40. Coolant exiting the core 14 flows along the underside of the upper core plate 40 and upwardly through a plurality of perforations 42. The coolant then flows upwardly and radially outward to one or more outlet nozzles 44.

Figure 2:
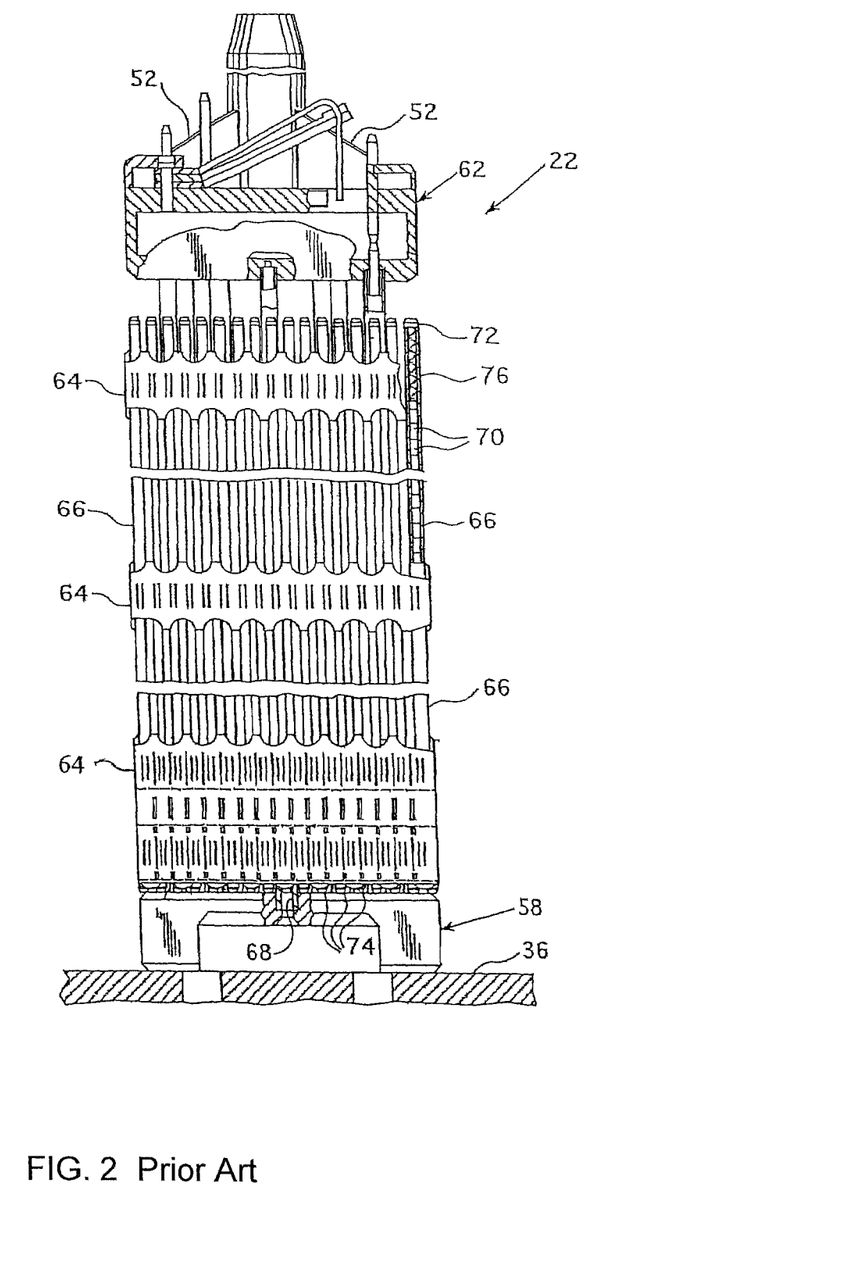
FIG. 2 is an elevational view, partially in section of a fuel assembly illustrated as shown in FIG. 1 in vertically shortened form, with parts broken away for clarity, in accordance with the prior art.

One of the exemplary fuel assemblies 22 as shown in FIG. 1 is shown in more detail in FIG. 2. Each of the fuel assemblies 22 includes radially-extending flukes or arms 52 and fuel rods 66 grouped in an array thereof. The fuel rods 66 are held in spaced relationship with one another by the grids 64 spaced along the fuel assembly length. At its lower end, a bottom nozzle 58 supports each of the fuel assemblies 22 on a lower core plate 36. At its upper end, each of the fuel assemblies 22 includes a top nozzle 62. An instrumentation tube 68 is located in the center and extends between and is mounted to the bottom and top nozzles 58 and 62. Each fuel rod 66 includes a plurality of nuclear fuel pellets 70 and is closed at its opposite ends by upper and lower end plugs 72 and 74, respectively. The pellets 70 are maintained in a stack by a plenum spring 76 disposed between the upper end plug 72 and the top of the pellet stack. The fuel pellets 70, composed of fissile material, are responsible for creating the reactive power of the reactor.

Each of the fuel rods 66 includes a cladding which surrounds the pellets to function as a barrier to prevent the fission by-products from entering the coolant and further contaminating the reactor system. The cladding on the fuel rods may be composed of a zirconium (Zr) based alloy. The cladding may include Zr and as much as about two percent by weight of other metals, such as niobium (Nb), tin (Sn), iron (Fe), chromium (Cr) and combinations thereof.

It is known in the art that there are various concerns relating to nuclear fuel rod cladding, including rapid corrosion of the Zr alloy tube at elevated temperatures associated with an accident scenario. In the event of an accident such as a Loss of Coolant Accident, temperatures inside the reactor core can exceed 1200° C. At very high temperatures, Zr rapidly oxidizes in the presence of steam which causes degradation of the fuel rods and production of large amounts of hydrogen which can lead to chemical explosions. Furthermore, breakdown of the fuel/cladding barrier in combination with explosions can cause wide-spread contamination of the plant and surrounding environment.

Applying to the outside surface of the fuel element an oxidation resistant coating that is capable of withstanding high temperatures, e.g., about 1200° C. and above, can provide operators and safety systems a longer time period to restore the reactor core to safe conditions and therefore, at least reduce and potentially avoid the potential negative consequences associated with Zr oxidation and fuel rod degradation in an accident scenario.

It is an object of this invention to provide compositions and methods for manufacturing a Zr alloy nuclear fuel cladding having an intermediate metallic layer between the Zr alloy and a chromium coating which is applied to the Zr alloy nuclear fuel element. The intermediate metallic layer and the chromium coating on the Zr alloy substrate enhance corrosion resistance by imparting a protective chromium oxide layer after exposure to steam or water. Known conventional deposition apparatus and techniques are used to apply the adherent intermediate metallic layer and chromium coating.

SUMMARY OF THE INVENTION

In one aspect, the invention provides a coated composite including a zirconium alloy substrate, a first coating composition deposited on the substrate to form a first coating layer and a second coating composition deposited on the first coating layer to form a second coating layer. The first coating composition includes an elemental metal and the second coating composition includes elemental chromium.

The substrate can be fuel element for a nuclear water reactor. In certain embodiments, the substrate is a fuel rod cladding.

The elemental metal can be a noble metal or other appropriate metals. In certain embodiments, the elemental metal is selected from the group consisting of palladium, nickel, copper and combinations thereof.

The elemental metal can have a melting point greater than a pre-determined temperature. In certain embodiments, the melting point is greater than 1200° C.

A eutectic composition may form at an interface selected from the group consisting of an interface between the first coating layer and the substrate and an interface between the first coating layer and the second coating layer. The elemental metal can be selected such that the melting point of the eutectic composition is greater than a pre-determined temperature. In certain embodiments, the melting point is greater than 1200° C.

The elemental metal can have a low neutron absorption cross-section.

In another aspect, the invention provides a method of coating a zirconium alloy substrate for use in a nuclear water reactor. The method includes obtaining the zirconium alloy substrate, depositing on an exterior surface of the substrate a first coating composition to form a first coating layer and depositing on the first coating layer a second coating composition to form a second coating layer. The first coating composition includes an elemental metal and the second coating composition includes elemental chromium.

The first coating composition and the second coating composition can be each deposited using electro-deposition. In certain embodiments, the second coating composition is deposited using an aqueous chromic acid bath.

The first coating composition and the second coating composition can be each deposited employing a process selected from the group consisting of thermal spray, plasma spray, wire arc coating, chemical vapor deposition, electron beam physical vapor deposition, sputtering, pulsed laser deposition, electroplating, electrophoretic deposition, electroless coating, and atomic layer deposition.

The first coating layer and the second coating layer can be deposited such as to form a protective coating having a thickness of about 1 to about 20 microns.

BRIEF DESCRIPTION OF THE DRAWINGS

A further understanding of the invention can be gained from the following description of the preferred embodiments when read in conjunction with the accompanying drawings in which.

DESCRIPTION OF THE PREFERRED EMBODIMENT

The invention relates generally to fuel rod elements for use in nuclear water reactors, such as pressurized water reactors and boiling water reactors. The fuel rod elements include a zirconium (Zr) alloy substrate, e.g., cladding. The cladding may be composed and constructed of a variety of conventional materials known in the art. As previously described herein, it is known to construct fuel rod cladding for a nuclear water reactor from Zr alloy containing a majority amount of Zr and a minority amount, e.g., up to about 2% by weight based on total weight of the composition, of other metals, such as but not limited to niobium (Nb), tin (Sn), iron (Fe), chromium (Cr) and combinations thereof.

Figure 3:
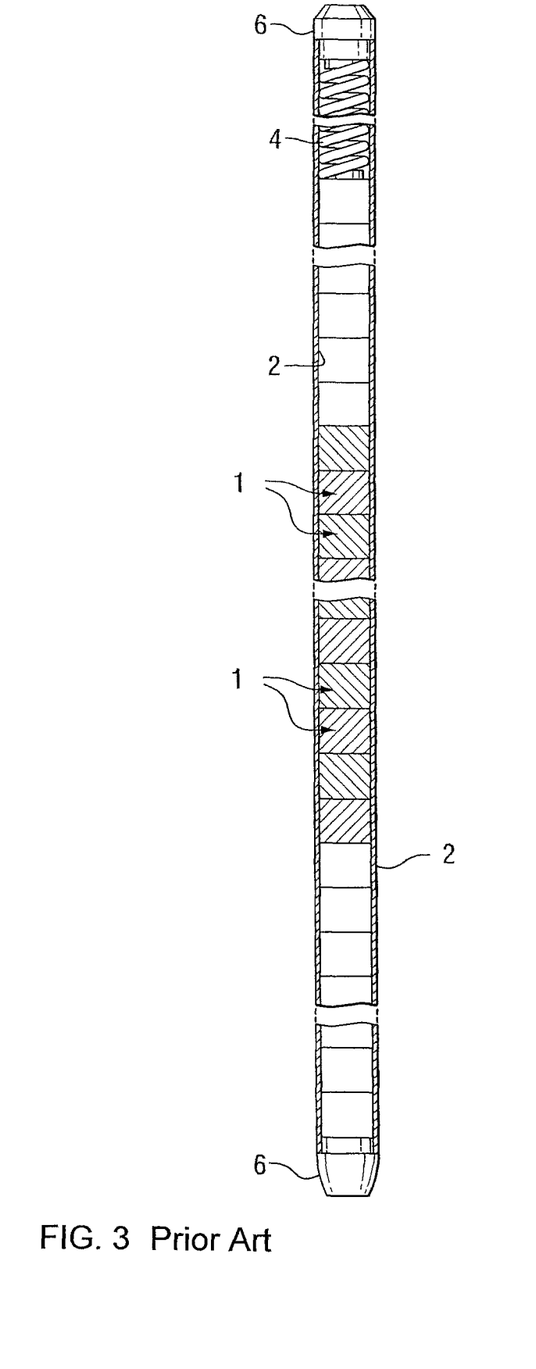
FIG. 3 is a cross-section view, partially in section of a fuel rod, in accordance with the prior art.

FIG. 3 illustrates a prior art design which shows a stack of fuel pellets 1, a Zr alloy fuel rod cladding 2, a spring hold down device 4, and end plugs 6. The fuel rod cladding 2 is typically in the shape of an elongated tube having a cavity formed therein and two opposing open ends. One of the end plugs 6, i.e., the one positioned closest to the hold down device 4, is typically referred to as the top end plug. The thickness of the tube wall can vary. In certain embodiments, the tube wall thickness is from about 100 to about 1000 microns or from about 200 to 400 microns. The cavity has fuel pellets 1 contained therein and typically a hold down device 4, such as a spring, to maintain the configuration, e.g., a stack, of the fuel pellets 1. One of the end plugs 6 is positioned at or in each open end of the fuel rod cladding 2 to provide a seal and prevent reactor coolant circulating in the core from entering the cavity of fuel rod cladding 2. The fuel rod cladding 2 is positioned in the core of a nuclear water reactor.

The Zr alloy substrate is at least partially coated with an oxidation-resistant coating material or composition that includes elemental chromium (Cr) to enhance corrosion resistance of the substrate under nuclear reactor accident conditions. A protective chromium oxide layer is formed when exposed to steam or water. The elemental chromium-containing coating is applied using known conventional deposition apparatus and techniques. In certain embodiments, the elemental chromium-containing coating is applied employing conventional electro-deposition apparatus and techniques which include the use of an aqueous chromic acid bath. A disadvantage of this technique is that the chromic acid can result in significant oxidation of the Zr alloy substrate.

To reduce or preclude oxidizing the Zr alloy substrate, an intermediate metallic layer is deposited on the Zr alloy substrate prior to deposition of the elemental chromium-containing coating. Generally, the invention includes depositing the composition or material of the intermediate metallic layer on, e.g., directly on, the exterior surface of the Zr alloy substrate e.g., cladding, to form a first exterior coating. The intermediate metallic layer is deposited using known conventional deposition apparatus and techniques which may be the same or similar to the deposition of the elemental chromium-containing layer. The intermediate metallic layer can provide one or more of the following benefits: (i) protection of the Zr alloy substrate from oxidation during deposition of the elemental chromium-containing coating, (ii) enhanced adherence of the elemental chromium-containing coating to the Zr alloy substrate, and (iii) separation of the elemental chromium-containing coating from the Zr alloy substrate to avoid Zr—Cr reactions.

The compositions and materials used for the intermediate metallic layer can include one or more elemental metals selected from those known in the art. Suitable elemental metals include but are not limited to noble metals and combinations thereof. In certain embodiments, the elemental metal for use in the intermediate metallic layer includes nickel, copper, palladium and combinations thereof.

In certain embodiments, the elemental metal is selected such that it has a melting point that is higher than a pre-determined temperature. For example, in a nuclear reactor accident the coolant temperature may reach or exceed 1200° C. Thus, it may be preferable to select a metal element that has a melting point greater than 1200° C. For example, palladium may be a preferred elemental metal for use in certain embodiments of the invention due to its high melting point of 1550° C.

In other embodiments, the elemental metal may be selected taking into consideration the potential formation of a eutectic composition (or other intermediate composition of relatively low melting point) between the intermediate metallic layer and the Zr alloy or the intermediate metallic layer and the elemental chromium-containing coating. In certain embodiments, the eutectic composition may have a melting point that is lower than a pre-determined accident temperature or lower than the melting point of the elemental metal in the intermediate metallic layer. The lower melting point of the eutectic composition may impact adhesion of the elemental chromium-containing coating to the Zr alloy substrate. Thus, the elemental metal may be selected such that an eutectic composition formed therefrom has a melting point that is greater than a pre-determined temperature, such as greater than the coolant temperature during a nuclear reactor accident, e.g., greater than 1200° C.

In certain embodiments, the elemental metal may be selected taking into account its neutron cross-section. For example, an elemental metal with a low neutron absorption can be selected to minimize the impact on neutron absorption from introducing additional materials/layers onto the cladding or thin layers can be utilized A general neutron cross-section range of about 0.1 barn to about 7.0 barns is inherent for some of the elemental metals that can be utilized for the intermediate metallic layer.

In one embodiment, palladium (Pd) may be selected as the elemental metal for use in the invention based on the high melting point of a Zr—Pd eutectic composition that may form. When employing Pd as the elemental metal, it is preferred to apply a thin coating of the intermediate metallic composition to reduce the impact of the neutron cross section of the Pd.

In considering the use of Cu as the elemental metal, it is taken into account that even though copper has a favorable, e.g., low, neutron cross section, a Zr—Cu eutectic composition that may form has a lower melting point than a Zr—Pd eutectic Thus, the selection of a suitable or optimal elemental metal for use in the invention may take into account various considerations.

The amount of the elemental metal can vary. In certain embodiments, the elemental metal constitutes from about 1% to about 99% by weight of the total composition. In certain embodiments, it is preferred to employ a minimum amount of the elemental metal in the intermediate metallic layer.

The composition or material of the elemental chromium-containing coating is subsequently deposited on the intermediate metallic layer, e.g., the first exterior coating, to form a second exterior coating thereon. The resulting Zr alloy substrate or fuel element has a multilayer protective coating. As described herein, the first tier which is the intermediate metallic layer is effective to assist in adhering the elemental chromium-containing coating and the elemental chromium-containing coating is effective to provide high-temperature oxidation resistance in the event of a nuclear reactor accident.

Each layer of the multilayer protective coating can be applied using deposition apparatus and techniques as previously described. In certain embodiments, the deposition process produces a thin, dense coating that will form a chromium oxide passivation layer when exposed to steam or water to protect the underlying Zr alloy substrate. The thickness and denseness of the coating can vary. In certain embodiments, the total thickness of the protective coating is from about 1 to about 20 microns. Further, in certain embodiments, the composition used to form the intermediate metallic layer can include palladium as the metal element. The use of palladium is advantageous in that its melting point of 1550° C. exceeds an accident scenario temperature of 1200° C. However the thickness of the palladium layer should be as thin as possible to minimize the effects that result from the neutron cross-section of the intermediate metallic layer As previously described, fuel elements include a plug inserted into each end of the tube to contain the contents, e.g., fuel pellet, therein. The plugs may be constructed of the same or different material/composition as the cladding. In certain embodiments, wherein the multilayer protective coating of the invention is applied employing an aqueous bath in accordance with an electro-deposition process, each of the two end plugs may be inserted into the opposing open ends of the cladding prior to coating the cladding. Further, it is contemplated that in addition to applying the coating to the exterior surface of the Zr alloy cladding, the coating also may be applied to the surface of each of the end plugs which is substantially flush with the tubular ends of the fuel element to form closed ends. In a conventional fuel loading process, one end plug is inserted and attached to an open end of the cladding such as to seal the one end, the fuel pellets and stack hold down spring are then loaded into the cavity of the cladding and following loading, the other end plug is inserted and attached to the other open end of the cladding. As an alternative, the fuel pellets and stack hold down may be loaded into the cladding and subsequently, both of the end plugs may be inserted and attached to the open ends of the cladding.

In certain other embodiments, deposition of the multilayer protective layer may be conducted prior to or following loading of the fuel and hold down device in the cavity, and insertion of the end plugs in the open ends of the cladding.

The multilayer layer coating on the exterior surface of the fuel rod cladding is applied using a two-step method. The first step includes deposition of a first coating composition on the exterior surface of the Zr alloy substrate to form the first exterior coating, i.e., the intermediate metallic layer, on the substrate. The second step includes deposition of a second coating composition on the surface of the first exterior coating to form the second exterior coating, i.e., the elemental chromium-containing coating.

Figure 4:
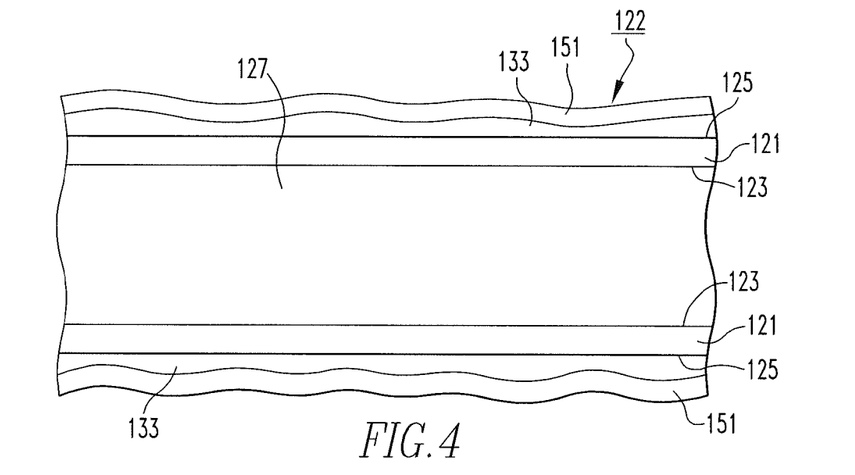
FIG. 4 is a cross-sectional view of a fuel rod cladding substrate having first and second coatings deposited on the exterior surface, in accordance with certain embodiments of the invention.

FIG. 4 illustrates a fuel rod cladding 122 in accordance with certain embodiments of the invention. The cladding 122 includes an elongated tube wall 121 having an interior surface 123, an exterior surface 125, and forming a cavity 127. An intermediate metallic composition is deposited on the exterior surface 125 of the cladding 122 to form an intermediate metallic layer, e.g., first coating, 133 on the exterior surface 125. A chromium composition is deposited on the intermediate metallic layer 133 to form a chromium coating, e.g., second coating, 151 on the intermediate metallic layer 133.

Figure 5:
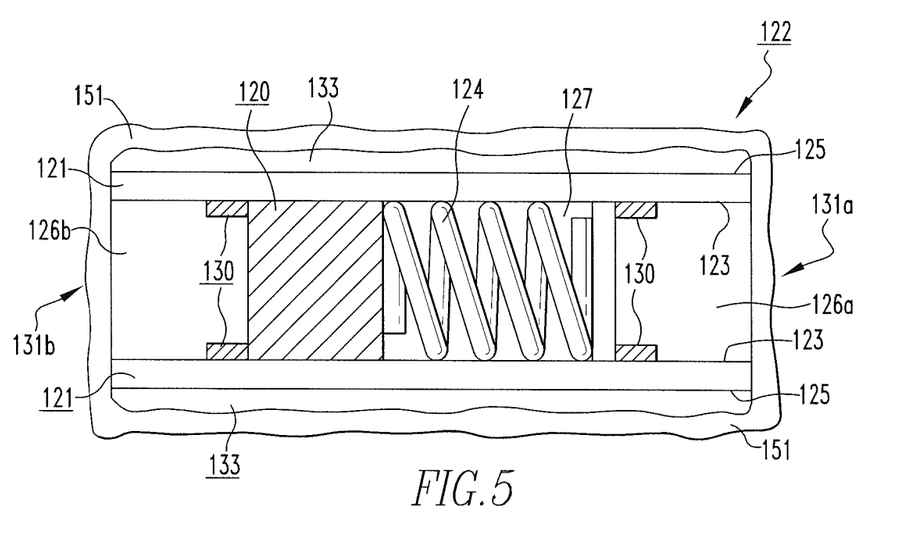
FIG. 5 is a cross-sectional view of a fuel rod cladding having a first and second coatings deposited on the exterior surface, in accordance with certain embodiments of the invention.

FIG. 5 illustrates a fuel rod cladding 122 in accordance with certain embodiments of the invention. FIG. 5 includes the elongated tube wall 121, interior surface 123, exterior surface 125, cavity 127, intermediate metallic layer 133 and chromium coating 151, as shown in FIG. 4. In addition, FIG. 5 shows a stack of fuel pellets 120 and a hold down device 124 positioned within the cavity 127, and a first end 131a and a second end 131b. A first end plug 126a is positioned and secured in the first end 131a and a second end plug 126b is positioned and secured in the second end 131b. As shown in FIG. 5, the intermediate metallic layer 133 and the chromium coating 151 are effective to completely enclose or encapsulate the cladding tube 122 including the end plugs 126a,b.

In general, the first and second coatings of the invention may be applied to the zirconium alloy substrate using various known processes. For example, each of the first coating and second coating can be applied using electro-deposition processes that are known in the art. When these coatings are applied by employing electro-deposition, one or both of the intermediate metallic layer and the chromium-containing coating may be referred to as a strike layer.

Additional known deposition processes include employing a thermal spray gun and parameters specific for creating a single layer for each of the coatings. In certain embodiments, the composition for the coating can be applied using a thermal spray process, such as Hyper-Velocity-Oxygen-Fuel (HVOF), Hyper-Velocity-Air-Fuel (HVAF), or combinations thereof. These processes cause particles of the coating composition to adhere to the substrate surface, for example, and to each other to form a coating. The temperature used in the HVOF process is typically about 3000 K. Further, in the HVOF process, it is typical to employ an average particle velocity of about 450 m/s for metal particles of an average size of about 5 microns to about 35 microns.

In the HVOF thermal spray process there are a number of HVOF guns that use different methods to achieve high velocity spraying. One method is basically a high pressure water-cooled HVOF combustion chamber and long nozzle. In the method, fuel (kerosene, acetylene, propylene and hydrogen) and oxygen are fed into the chamber. Combustion produces a hot high-pressure flame which is forced down a nozzle, increasing its velocity. Powder, e.g. the composition of the coating, may be fed axially into the HVOF combustion chamber under high pressure or fed through the side of a nozzle where the pressure is lower.

Another HVOF method uses a simpler system of a high pressure combustion nozzle and air cap. Fuel gas (e.g. propane, propylene or hydrogen) and oxygen are supplied at high pressure, combustion occurs outside the nozzle but within an air cap supplied with compressed air. The compressed air pinches and accelerates the flame and acts as a coolant for the HVOF gun. Powder is fed at high pressure axially from the center of the nozzle. Thermal spray processes typically minimize oxidation of the particles while in the hot flame, but the particles have enough energy to flatten onto the surface of the Zr alloy substrate to form a dense coating.

In another embodiment, the coating may be applied using a plasma spray process as is known in the art. Plasma spray processes typically apply the coating by spraying molten or heat-softened material onto a surface to provide a coating. The coating composition, in the form of a powder, is injected into a very high temperature plasma, where it is rapidly heated and accelerated to a high velocity. For example, the flame temperature of a plasma torch may be about 15,000 K. The hot material impacts on the substrate surface and rapidly cools forming a coating. This plasma spray process carried out correctly can be called a "cold process" (relative to the substrate material being coated) as the substrate temperature can be kept low during processing avoiding damage, metallurgical changes, and distortion to the substrate material.

In certain embodiments, a plasma spray gun is utilized that comprises a copper anode and tungsten cathode, both of which are water cooled. Plasma gases (argon, nitrogen, hydrogen, helium) flow around the cathode and through the anode which is shaped as a constricting nozzle. The plasma is initiated by a high voltage discharge which causes localized ionization and a conductive path for a DC arc to form between cathode and anode. The electrical heating in the arc can cause the gas to reach an extreme temperature, dissociate, and ionize to form plasma. The plasma exits the anode nozzle as a free or neutral plasma (plasma which does not carry electric current), which is quite different from a Plasma Transferred Arc coating process where the arc extends to the surface to be coated. When the plasma is stabilized and ready for spraying, the electric arc extends down the nozzle, instead of shorting out to the nearest edge of the anode nozzle. This stretching of the arc is due to a thermal pinch effect. Cold gas around the surface of the water cooled anode nozzle being electrically non-conductive constricts the plasma arc, raising its temperature and velocity. The coating composition is fed into the plasma most commonly via an external powder port mounted near the anode nozzle exit. The powder is so rapidly heated and accelerated that spray distances can be in the order of about 25 mm to about 150 mm (about 1 to 6 inches).

In another embodiment, the coating may be applied via a wire arc coating process. In a wire arc coating process, two wires with an electrical potential are brought together at an angle of about 20 degrees. A current is drawn through the wires and they melt the coating material to be applied at the wires' point of contact. An atomizing gas propels the molten particles at the substrate at low velocity.

Alternatively, the coating may be applied using a coating technique known in the art, such as chemical vapor deposition (CVD), electron beam physical vapor deposition, sputtering, pulsed laser deposition, electroplating, electrophoretic deposition, electroless coating, atomic layer deposition or any other suitable method.

While specific embodiments of the invention have been described in detail, it will be appreciated by those skilled in the art that various modifications and alternatives to those details could be developed in light of the overall teachings of the disclosure. Accordingly, the particular embodiments disclosed are meant to be illustrative only and not limiting as to the scope of the invention which is to be given the full breadth of the appended claims and any and all equivalents thereof.

What is claimed is:

1. A coated composite cladding for a fuel rod in a nuclear water reactor, comprising:

a zirconium alloy elongated tube having a cavity formed therein, an interior surface and an exterior surface, structured to hold nuclear fuel in the cavity;

a first coating composition deposited on the exterior surface of the elongated tube to form a first coating layer, the first coating composition comprising an elemental metal; and a second coating composition deposited on the first coating layer to form a second coating layer, the second coating composition comprising elemental chromium.

2. The coated composite of claim 1, wherein the elemental metal is a noble metal.

3. The coated composite of claim 1, wherein the elemental metal is selected from the group consisting of palladium, nickel, copper and combinations thereof.

4. The coated composite of claim 1, wherein the elemental metal has a melting point greater than coolant temperature during a nuclear reactor accident.

5. The coated composite of claim 4, wherein the melting point is greater than 1200° C.

6. The coated composite of claim 1, wherein the elemental metal has a low neutron absorption cross-section in a range of about 0.1 barn to about 7.0 barns.

* * * * *